(12) United States Patent
Tadeparthy et al.

(10) Patent No.: US 7,002,506 B1
(45) Date of Patent: Feb. 21, 2006

(54) PROVIDING PIPE LINE ADC WITH ACCEPTABLE BIT ERROR AND POWER EFFICIENCY COMBINATION

(75) Inventors: Preetam Charan Anand Tadeparthy, Bangalore (IN); Jomy G Joy, Bangalore (IN); Gaurav Chandra, Bangalore (IN); Sumeet Mathur, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/905,271

(22) Filed: Dec. 23, 2004

(51) Int. Cl.
- H03M 1/38 (2006.01)
- H03M 1/00 (2006.01)
- G11C 27/02 (2006.01)
- H03K 17/00 (2006.01)
- H03K 5/00 (2006.01)

(52) U.S. Cl. .................. 341/161; 341/122; 327/94
(58) Field of Classification Search ........... 341/161, 341/118, 120, 156, 122, 172; 327/126, 94, 327/95
See application file for complete search history.

(56) References Cited

U.S. PATENT DOCUMENTS

| | | | | |
|---|---|---|---|---|
| 4,195,282 A | * | 3/1980 | Cameron | 341/172 |
| 4,439,693 A | * | 3/1984 | Lucas et al. | 327/95 |
| 4,584,559 A | * | 4/1986 | Penney | 341/122 |
| 5,499,027 A | * | 3/1996 | Karanicolas et al. | 341/120 |
| 5,638,013 A | * | 6/1997 | Iwata et al. | 327/126 |
| 5,668,549 A | * | 9/1997 | Opris et al. | 341/118 |
| 5,675,340 A | * | 10/1997 | Hester et al. | 341/156 |
| 5,831,562 A | * | 11/1998 | Van Auken et al. | 341/122 |
| 6,028,546 A | * | 2/2000 | Signell et al. | 341/161 |
| 6,169,427 B1 | * | 1/2001 | Brandt | 327/94 |
| 6,184,809 B1 | * | 2/2001 | Yu | 341/120 |
| 6,222,471 B1 | * | 4/2001 | Nagaraj | 341/120 |
| 6,369,744 B1 | * | 4/2002 | Chuang | 341/161 |
| 6,469,652 B1 | * | 10/2002 | Aude | 341/172 |
| 6,515,611 B1 | * | 2/2003 | Fetterman et al. | 341/161 |
| 6,608,504 B1 | * | 8/2003 | Fujimoto | 327/94 |
| 6,636,084 B1 | * | 10/2003 | Sarraj | 327/95 |
| 6,753,801 B1 | * | 6/2004 | Rossi | 341/161 |
| 6,801,151 B1 | * | 10/2004 | Opris | 341/161 |
| 6,822,601 B1 | * | 11/2004 | Liu et al. | 341/161 |
| 6,891,486 B1 | * | 5/2005 | Pentakota et al. | 341/120 |

* cited by examiner

Primary Examiner—Patrick Wamsley
(74) Attorney, Agent, or Firm—Abdul Zindani; W. James Brady, III; Frederick J. Telecky, Jr.

(57) ABSTRACT

A pipeline ADC implemented with both general charge redistribution stages and flip-around charge redistribution stages. Using the flip-around charge redistribution stages leads to reduced power/area consumption, but could lead to accumulation and propagation of errors. general charge redistribution stages are used to control/contain the errors. As a result, the ADC is implemented to achieve an acceptable bit error and power efficiency combination. According to another aspect of the present invention, the first stage is implemented as a flip-around charge redistribution stage (in combination with general charge redistribution stages in subsequent stages) since there is no accumulation of error from prior stages, and implementing the first stage as a flip-around charge redistribution stage gives maximum advantages in power efficiency.

9 Claims, 5 Drawing Sheets

PROVIDING PIPE LINE ADC WITH ACCEPTABLE BIT ERROR AND POWER EFFICIENCY COMBINATION

FIELD OF THE INVENTION

The present invention relates generally to the design of analog to digital converters (ADC), and more specifically to the design and implementation of pipelined ADCs providing acceptable bit error and power efficiency combination.

RELATED ART

An analog to digital converter (ADC) is generally used to sample an analog signal at various time instances, and generate a digital code representing the strength of the sampled analog signal at the corresponding time instance. A pipelined ADC is a type of ADC which contains multiple (pipelined) stages, with each stage resolving a number of bits forming a sub-code. The sub-codes generated by various stages are used to generate a digital code corresponding to analog input.

The input signal is first sampled by a sample and hold amplifier (SHA) (also contained within the pipelined ADC), and subsequently digitized by the pipeline stages. Each stage typically contains a sub-ADC, a sub-DAC and an amplifier. The sub-ADC typically generates the corresponding sub-code which is provided as an input to the sub-DAC. The output of the sub-DAC is received by a subtractor that generates an analog signal which equals the difference ("residue signal") of the strength of the sampled signal and a signal strength corresponding to the generated sub-code. The amplifier amplifies this signal (generally by $2^P$) and maps the residue signal to an appropriate voltage level provided as an input signal to the next stage, wherein P represents the effective number of bits generated by the sub-ADC. The mapped signal is provided as an input signal to the next stage.

ADCs often need to be implemented to meet various requirements. One exemplary requirement is low bit error, which implies that the actual digital code generated by an ADC be as close as possible (ideally equal) to the ideal value corresponding to the strength of the input signal. Another example requirement is low power consumption, which implies that the ADC needs to consume as little electrical power as possible.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention enables a designer of an analog to digital converter (ADC) to achieve a desired combination of (low) bit error and power consumption by appropriate choice of both general charge redistribution stages and flip-around charge redistribution stages in the implementation of the ADC. The general charge redistribution stages may be chosen as middle (intermediate) stages to avoid accumulation of bit error (e.g., due to integral non-linearity) and the flip-around charge redistribution stages may be chosen otherwise to reduce the aggregate power consumption. The placement of the two types of stages can be controlled to attain an acceptable performance combination of bit error and power consumption.

According to an aspect of the present invention, a flip-around charge redistribution stage is chosen as a first stage of an ADC, which enables reduction of the aggregate power consumption (compared to the use of a general charge redistribution stage, which may require high power consumption). Any integral non-linearity introduced by such a first stage can be controlled/limited by subsequent general charge redistribution stages. As a result, the ADC may provide acceptable low bit error in spite of the presence of the flip-around charge redistribution stage as the first stage.

According to another aspect of the present invention, two general charge redistribution stages are used as consecutive stages (i.e., the output of general charge redistribution stage being provided as the input to the other general charge redistribution stage), and such consecutive stages are used in combination with a flip-around charge redistribution stage in an ADC. The use of the consecutive general charge redistribution stages operates to control/minimize the propagation of the non-linearity (which could lead to bit errors) to subsequent stages, which are potentially implemented as flip-around charge redistribution stages for reducing power consumption.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Pipelined ADC

Figure 1:
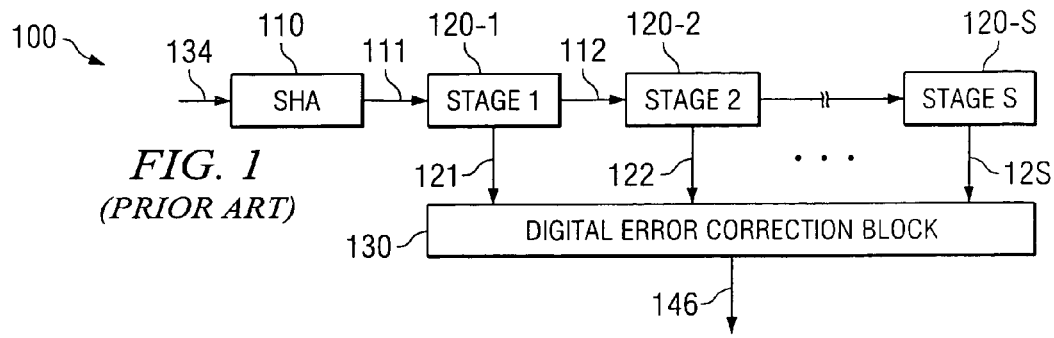
FIG. 1 is a block diagram illustrating the internal structure of an example pipeline ADC in which several aspects of the present invention are implemented.

FIG. 1 is a block diagram illustrating the details of an example pipelined ADC which is used to illustrate various aspects of the present invention. ADC 100 is shown containing sample and hold amplifier (SHA) 110, and stages 120-1 through 120-S and digital error correction block 130. Each block is described below in further detail.

SHA 110 samples input signal received on path 134 and holds the voltage level of the sample for further processing. Each stage 120-1 through 120-S generates a sub-code corresponding to a voltage level of an analog signal received as an input, and an amplified residue signal as an input to a (any) next stage. For example, stage 120-1 converts a voltage level on path 111 to generate a sub-code on path 121, and the amplified residue signal generated on path 112 is provided as an input to stage 120-2.

Digital error correction block 130 receives sub-codes from various stages, and generates a digital code corresponding to the sample received on path 134. Essentially, it performs a weighted addition of the sub-codes to generate the overall code, as is well known in the relevant arts. The generated digital code is provided on path 146.

Figure 2:
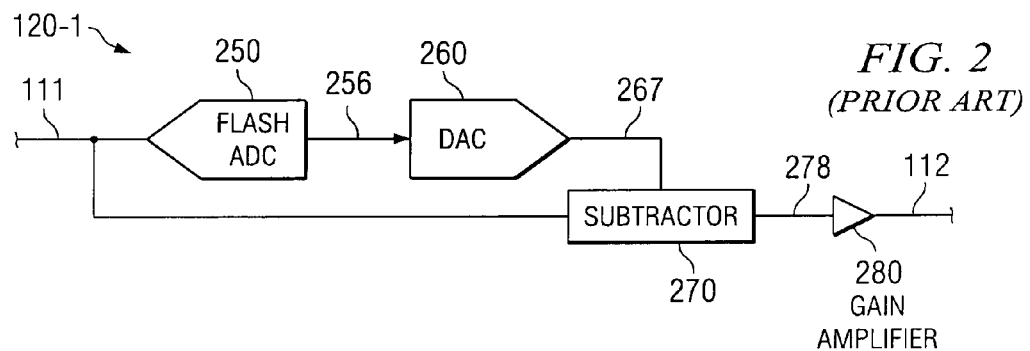
FIG. 2 is a block diagram illustrating the general operation of a stage of an ADC.

FIG. 2 further illustrates components contained in each stage (described with reference to stage 120-1 only, for conciseness) according to a known approach. Stage 120-1 is shown containing flash ADC 250, digital to analog converter (DAC) 260, subtractor 270 and gain amplifier 280. Flash ADC 250 (an example of a sub ADC) converts a sample of an analog signal received on path 111 into a corresponding P-bit sub-code provided on path 256 (contained in path 121 of FIG. 1, and P is less than N). DAC 260 converts the sub-code received on path 256 into corresponding analog signal (Vdac) on path 267.

Subtractor 270 generates a residue signal as the difference of sample 111 (Vi) and the analog signal received on path 267 (Vdac). Gain amplifier 280 amplifies the residue signal (Vi−Vdac) and is provided on path 112 as an amplified residue signal. The signal on path 112 is used to resolve the remaining bits in the N-bit digital code by the subsequent ADC stages. Subtractor 270, DAC 260, and gain amplifier 280 can be implemented using a capacitor network and an operational amplifier.

As noted above in the background section, ADCs need to be generated with low bit errors. Digital error correction block 130 may correct for errors in the sub-codes to some extent. Specifically, small errors in the comparator reference voltages can be easily corrected by digital error correction. However, some (typically large) errors in the sub-codes may not be entirely corrected due to various limitations of digital error correction block 130. Accordingly, it is generally required that each sub-code be accurate to the extent possible.

One source of error in the sub-code, commonly known as gain error, is non-accurate gain in the residue amplifiers. As noted above, in a P bit stage, the ideal gain needs to be $2^P$ (wherein ^ represents the 'to the power of' operation). Any deviation from this value leads to non-linearity that may not be corrected by the digital error correction.

Another source of error, known as settling error, is the finite bandwidth of the amplifier, due to which the signal does not "settle" to the desired value in a finite duration (e.g. within half the sampling period in one embodiment). This also causes non-linearities that may not be corrected by the digital error correction logic.

The non-ideal gain in different gain stages, and imperfect settling, can accumulate to cause large amounts of non-linearity in the pipeline (as described in sections below in further detail with respect to integral non-linearity). This leads to large errors in the final bits of the ADC. It is desirable that accumulation be minimized to reduce bit errors in the ADC.

Another requirement in the design of ADCs is reducing power consumption, as noted above in the Background Section. The factors that determine power consumption include the number of components in each stage, and the open-loop gain and bandwidth requirements of amplifier 280. The open-loop gain and bandwidth requirements of the amplifier may be high to ensure that the gain error and the settling error in closed loop operation is small. Thus, requirement of lower power consumption can often come in conflict with the requirement of reduced bit errors due to gain and settling errors.

An aspect of the present invention uses both general charge redistribution stages and flip-around charge redistribution stages to attain an acceptable combination of bit error and power consumption in a pipeline ADC. It is helpful to understand the operation and characteristics of the two types of stages to appreciate the manner in which the stages are used according to various features of the present invention. Accordingly, the two types of stages are described below with respect to FIGS. 3–6.

3. General Charge Redistribution Stage

Figure 3:
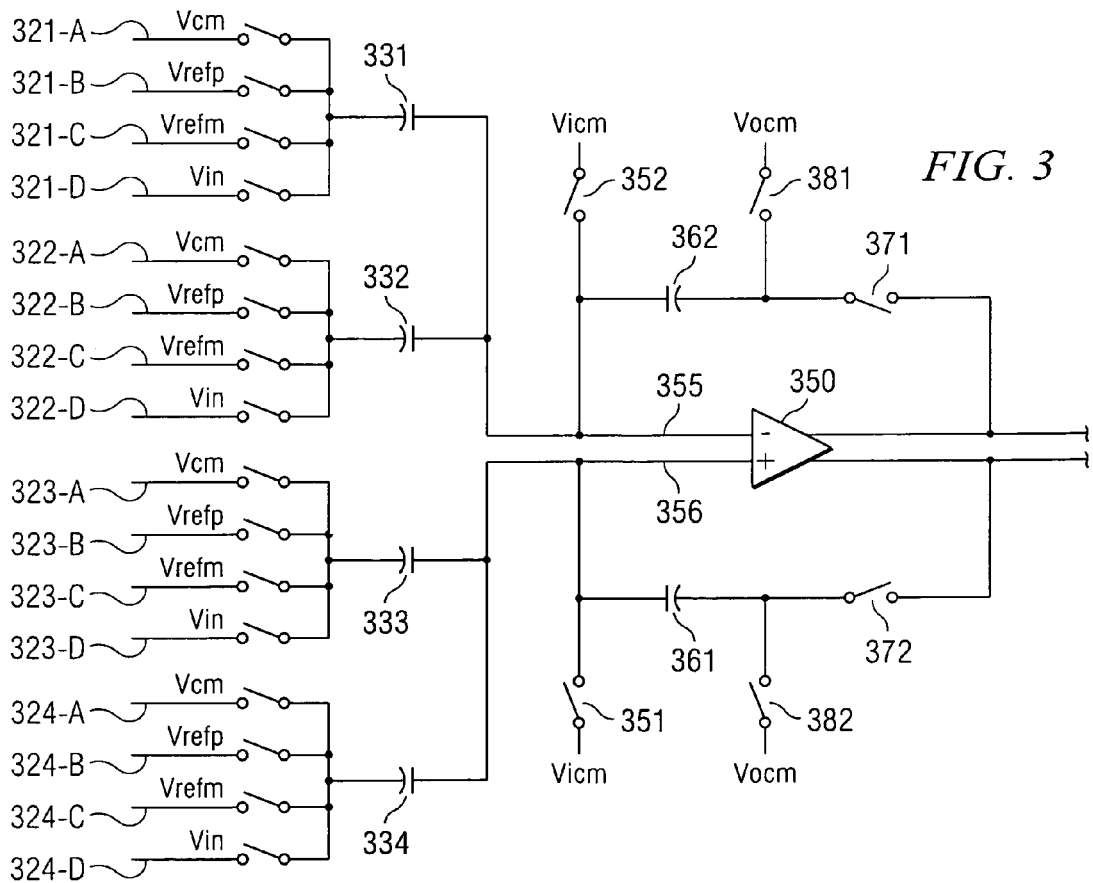
FIG. 3 is a circuit diagram illustrating the principles underlying the implementation of an embodiment of a general charge redistribution gain stage.

FIG. 3 is a circuit diagram illustrating the manner in which a stage (e.g, 120-2) can be implemented as a 'general' charge redistribution stage. A typical general charge redistribution stage (or a gain stage component therein) works on the principle of charge redistribution. In the first phase (sample phase), the input is sampled across the sampling capacitors and stored in the form of a charge. In the next phase (hold phase), it is redistributed across the feedback capacitor. Since the charge is completely redistributed to another (feedback) capacitor, this stage is often known as general charge redistribution stage. The term 'general' is used in conjunction with the stage of FIG. 3 to distinguish from the flip-around charge redistribution stages, also used according to various aspects of the present invention.

The component values can be adjusted to get a voltage gain, as well as any subtractive/additive operations to implement the DAC. This will now be described in detail, as being well known to one skilled in the relevant arts. As described below, the stage supports implementation of 2 bits sub-code, including 1 redundant bit. The circuit diagram is shown without sub-ADC (and thus referred to as a gain stage), however the operation of the sub-ADC is described below with reference to FIGS. 4A and 4B.

Stage 120-2 is shown containing operational amplifier 350, sampling capacitors 331–334, feedback capacitors 361 and 362, sampling switches 321D, 322D, 323D and 324D, DAC switches 321 A–C, 322A–C, 323A–C and 324A–C, common mode switches 351 and 352, reset switches 381 and 382, and feedback switches 371 and 372. The operation of each component is described below in further detail.

Sampling switches 321D, 322D, 323D and 324D, reset switches 381 and 382, and common mode switches 351 and 352 make contact (closed) during sampling phase (interval). The remaining switches are in break state (open) during the sampling phase. As a result, all the sampling capacitors 331–334 are connected to input signal Vin, and amplifier inputs 355 and 356 are connected to common mode input Vicm. One end of capacitors 361 and 362 is connected to common mode input Vicm while the other end is connected to another common mode input Vocm. Typically, Vicm and Vocm are set to ensure proper operation of the operational amplifier 350. Thus, input signal is sampled across the sampling capacitors 331–334, while the charge stored on capacitors 361 and 362 (due to previous phase) is reset.

During the hold phase, feedback switches 371 and 372 operate to connect feedback capacitors 361 and 362 to inputs of operational amplifier 355 and 356 respectively. Switches 321 A–C operate to connect capacitor 331 to one of Vrefp, Vrefm and Vcm terminal depending on sub code generated by sub-ADC as described below with reference to FIGS. 4A and 4B.

4. Principles of Operation of General Charge Redistribution Circuit

Figure 4A:
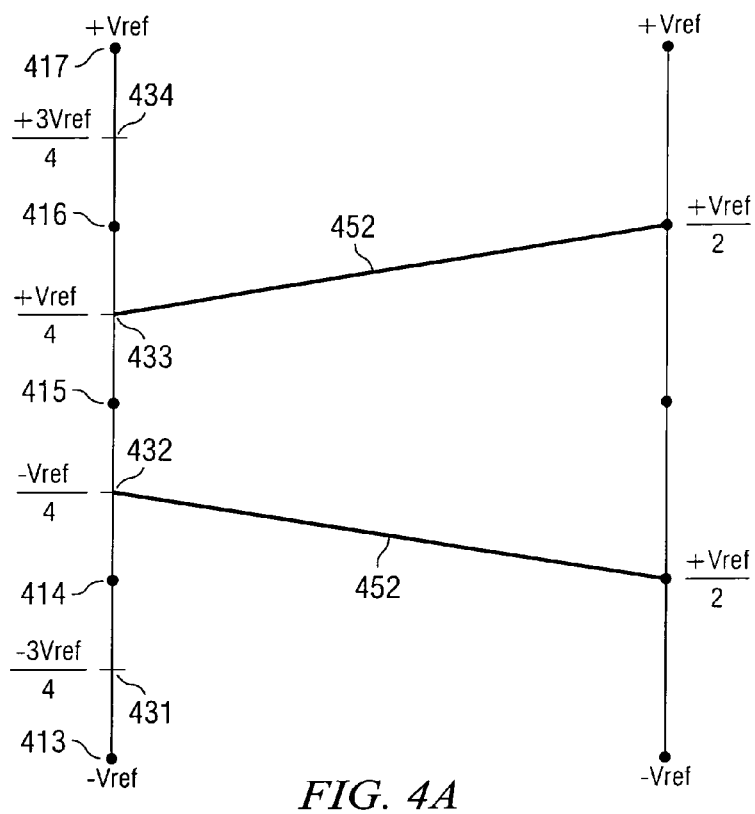
FIG. 4A illustrates the principle of operation of a general charge redistribution stage.
Figure 4B:
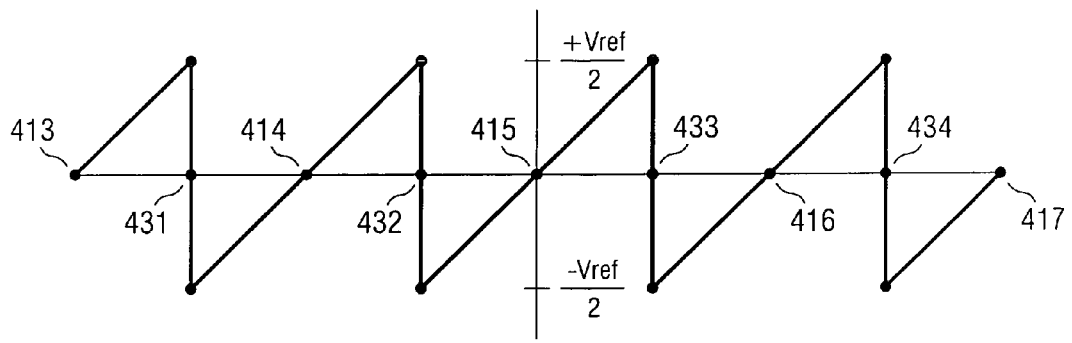
FIG. 4B is a graph illustrating the amplified residue signal for corresponding voltage levels of the input signal in a general charge redistribution gain stage.

FIGS. 4A and 4B together illustrate the principles of operation of charge redistribution circuit with a total of 2-bits including 1 redundant bit, and thus 1 effective bit. FIG. 4A is shown with input voltage range 400 (between −Vref and +Vref), DAC levels 413–417, sub ADC comparator reference levels 431–434, and amplified range 452 (representing the range of the input signal for the next stage).

Sub-ADC 250 is assumed to contain 4 comparators, comparing the input sample/voltage to four reference levels −3Vref/4, −Vref/4, +Vref/4, and +3Vref/4. The four voltage levels are indicated by reference levels 431–434. As seen from FIG. 4A, There are 5 different regions (413–431, 431–432, 432–433, 433–434, 434–417) demarcated by the 4 comparators (comparing with reference voltages 431–434), and the Sub-ADC generates one of 5 codes corresponding to −2, −1,0,+1 and +2, respectively.

This code is an input to error correction logic block 130 that collects inputs from all the stages and performs a weighted addition to generate the overall code (representing the sampled signal).

The 5 level comparison results are also used to operate switches (321A–D, 322A–D, 323A–D, and 324A–D) to generate five DAC levels −Vref, −Vref/2, 0, +Vref/2 and +Vref. The five levels are indicated by 413–417. The DAC levels are generated by connecting each of the capacitors 331 and 332 to either +Vref, −Vref or Vcm. Capacitors 333,334 are connected to opposite values to ensure differential operation. Since two capacitor values can be independently controlled here, a total of five DAC values are possible (++,−−, +0,−0,00, values like +− would be same as 00 only).

The DAC levels are chosen such that under ideal conditions, residue signal is between +Vref/4 and −Vref/4. For example, when input signal is in the range between levels 413 (−Vref) and 431 (−3Vref/4), all comparator outputs would be zero, and DAC level 413 (−Vref) is generated. The maximum residue signal equals −Vref/4.

As another example, when input signal is in the range between 431 (−3Vref/4) and 432 (−Vref/4), comparator with reference 431 outputs 1 and rest of the comparator outputs are at zero. DAC level 414 (−Vref/2) is generated in this case, and the residue signal is between +Vref/4 and −Vref/4.

The residue signal is then amplified by a factor of 2 such that the input to the next stage has an ideal range of +Vref/2 and −Vref/2 (as represented by 452). However, due to non-ideal operation (e.g., of amplification gain error or comparator reference level offsets), the residue signal may not fall within the ideal range.

Given that the next stage has the ability to receive an input signal in the range of +Vref and −Vref, an error of one bit in the prior stage can be corrected (and is referred to as providing one bit redundancy). From this, it may be appreciated that the ability to correct for an error of 1 bit (in a prior stage) is provided by using only a partial range of the input signal swing of a stage.

The description above is provided with respect to a 2-bit stage with 1-bit redundancy merely for illustration. However, in general, a N-bit stage with 1-bit redundancy would have $2^N$ comparators and $2^N+1$ DAC levels. The gain stage would have a gain of $2^{(N-1)}$.

FIG. 4B summarizes the variation of an output signal (provided as an input to the next stage) of a stage as a function of change in the input signal in the case of a general charge redistribution stage. The X-axis represents the input voltage varying from −Vref to +Vref, consistent with the description in FIG. 4A. Y-axis represents the amplified residue signal.

As may be appreciated, the amplified residue signal would ideally be between −Vref/2 to +Vref/2. Even in the presence of comparator offsets, the aggregate signal (i.e., ideal amplified residue signal plus the error signal) maps within the range of the subsequent stage (−Vref to +Vref), as long as the comparator offsets are small (in this case within +/−Vref/4). As a result, a one bit error correction (Vref/2) is provided in this approach.

However, the impact of gain error and settling error in the amplifier is different. It causes non-linearity that can not be corrected by the error-correction logic. The total error depends on the output signal swing. Since the output swing is restricted to within +/−Vref/2 (in the absence of offsets), the non-linearity is small. Moreover, any input from the previous stage would always map to within +/−Vref/2 (i.e. even if the previous stage output swings to +/−Vref). Thus, a general charge redistribution stage prevents the accumulation of non-linearities in a pipeline, as will be described further below when a flip-around gain stage is discussed.

However, a disadvantage of general charge redistribution stage is higher area and power dissipation as described in sections below in comparison to the flip-around charge redistribution stage.

5. Flip-Around Charge Redistribution Stage

Figure 5:
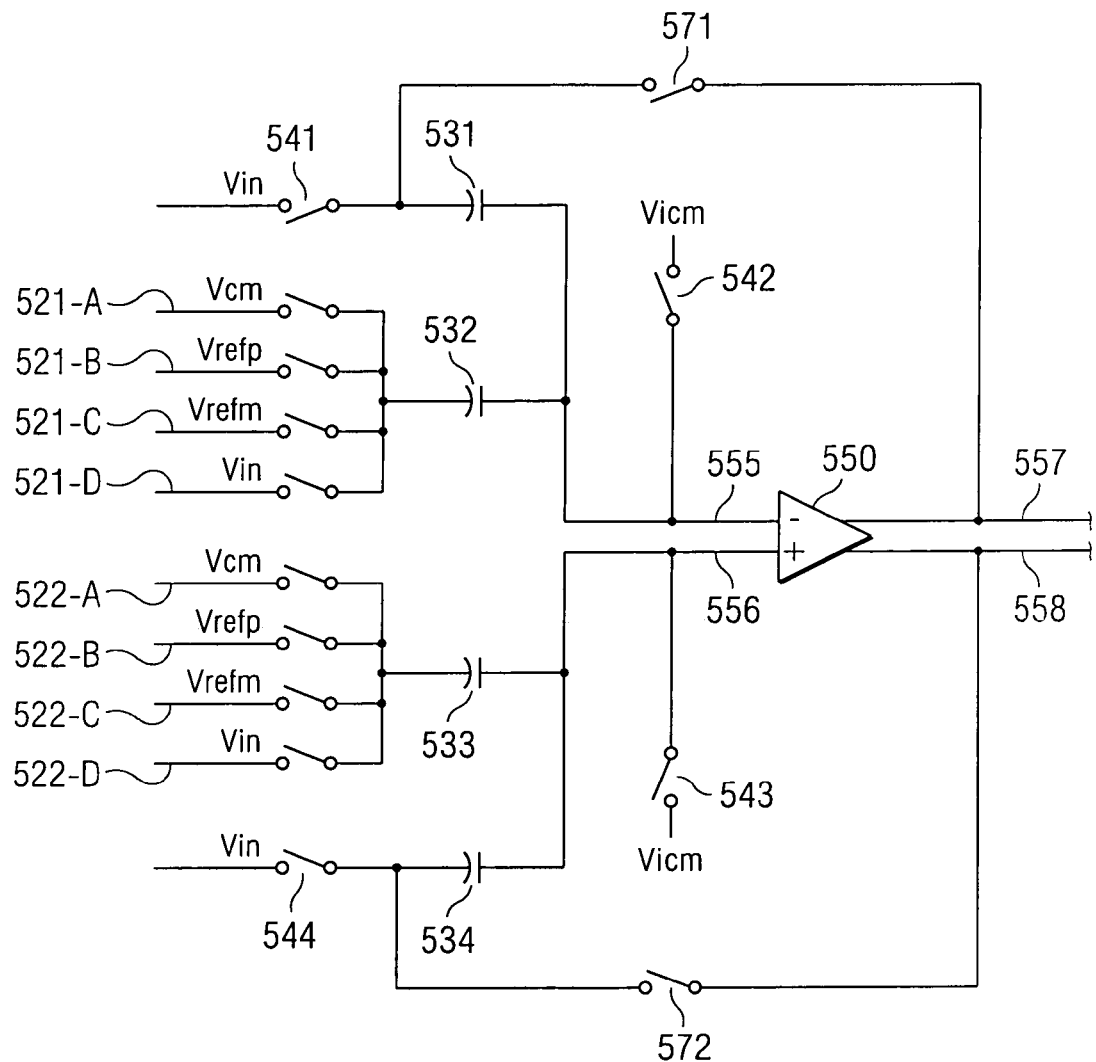
FIG. 5 is a circuit diagram illustrating the principles underlying the implementation of an embodiment of a flip-around gain stage.

FIG. 5 is a circuit diagram illustrating the manner in which a stage (e.g, 120-1) can be implemented as a flip-around charge redistribution stage. Similar to a general charge redistribution stage, it works on the principle of charge conservation, but the exact operation is slightly different, as will be described below. Also, similar to the general charge redistribution stage of FIG. 3, it supports implementation of a 2-bit sub-code with 1 effective bit, but has less redundancy, as will be described below. The circuit diagram is shown without sub-ADC, but the corresponding operation is described below with respect to FIGS. 6A and 6B. The reason for terming the charge redistribution stage of FIG. 5 as a flip-around charge redistribution stage, will be clearer from the description below.

Stage 120-1 is shown containing operational amplifier 550, sampling capacitors 531–534, sampling switches 541, 544, 521D and 522D, DAC switches 521 A–C and 522A–C, common mode switches 542 and 543, and feedback switches 571 and 572. The operation of each component is described below in further detail.

Sampling switches 541, 544, 521D, 522D, and common mode switches 542 and 543 make contact (closed) during sampling phase (interval). The remaining switches are in break state (open) during the sampling phase. As a result, all the sampling capacitors 531–534 are connected to input signal Vin, and amplifier inputs 555 and 556 are connected to common mode input Vicm. Typically, Vicm is set to a desired value to ensure proper operation of the operational amplifier 550.

During the hold phase, feedback switches 571 and 572 operate to connect sampling capacitors 541 and 544 to output terminals to operate as feedback capacitors. Unlike the general charge redistribution stage described above with respect to FIG. 3, where the charge is transferred to a different (feedback) capacitor, here the sampling capacitors are flipped around to operate as feedback capacitors. Hence this kind of gain stage 120-1 is referred to as a flip-around charge redistribution stage. Switches 321 A–C operate to connect capacitor 521 to one of Vrefp, Vrefm and Vcm terminals depending on sub code generated by sub-ADC as described below with reference to FIGS. 6A and 6B.

6. Principles of Operation of Flip-Around Charge Redistribution Circuit

Figure 6A:
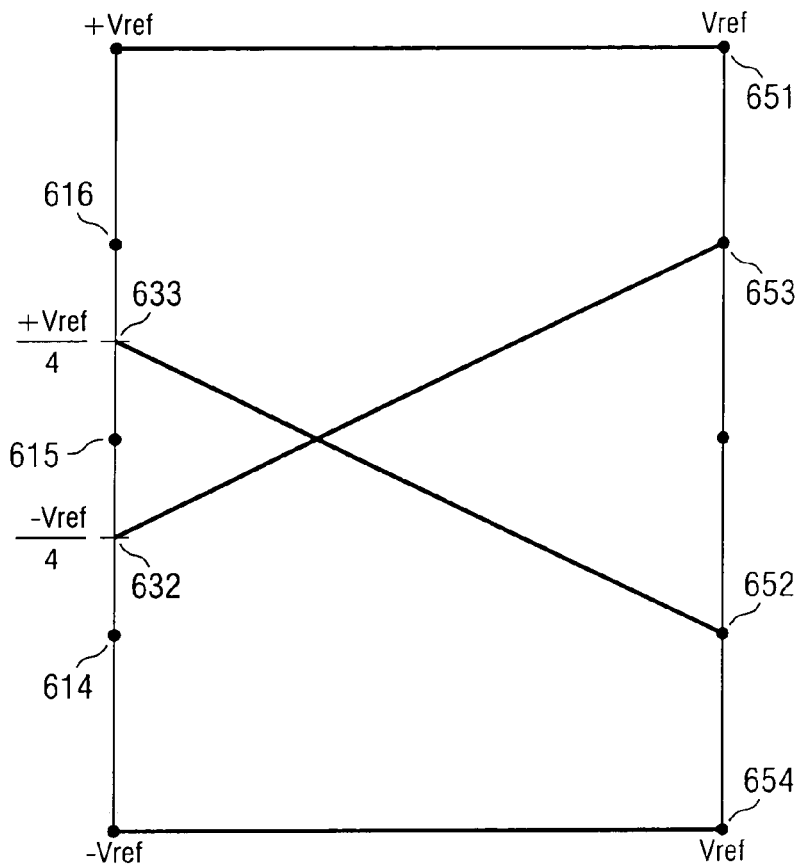
FIG. 6A illustrates the principle of operation of a flip-around gain stage.
Figure 6B:
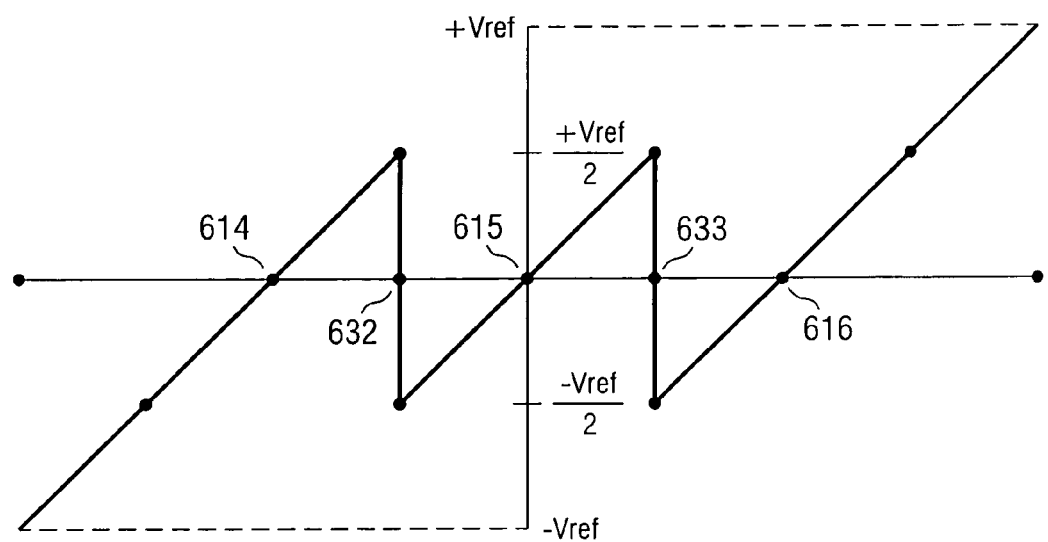
FIG. 6B is a graph illustrating the amplified residue signal for corresponding voltage levels of the input signal in a flip-around charge redistribution stage.

FIGS. 6A and 6B together illustrate the principles of operation of flip-around charge redistribution stage. FIG. 6A is shown with input voltage range 600 (between −Vref and +Vref), DAC levels 614–616, sub-ADC comparator reference levels 632 and 633, and amplified residue signal range for next stage equaling 3/2 of Vref represented for example by 651 to 652 or 653 to 654.

Sub-ADC 250 is assumed to contain 2 comparators, comparing the input sample/voltage to two reference levels −Vref/4 and +Vref/4. The two reference levels are indicated as 632–633. As can be observed from FIG. 6A, there are 3 different regions demarcated by the 2 comparators, and the Sub-ADC generates 3 codes corresponding to −1, 0 and +1, respectively. A 3 level code (instead of 5 in general charge redistribution stage) is used because of the different architecture of a flip-around charge redistribution stage, as will be explained below. This 3 level code is an input to the error correction logic that collects inputs from all the stages and performs a weighted addition to generate the overall digital code.

The 3-level comparison results are also used to operate switches (621 A–C, and 622A–C) to generate three DAC levels −Vref/2, 0 and +Vref/2, represented as 614–616. The DAC levels are generated by connecting the capacitor 532 to one of −Vref, 0 and +Vref (capacitor 533 is connected to the opposite value to ensure fully differential operation). Since the other capacitors 531, 534 are used in flip-around configuration, only one capacitor is available to decide the DAC values, and as a result only three DAC values are possible in this configuration, resulting in a 3-level coding.

The DAC levels are chosen such that the residue signal always occupies a signal range that is less than the full signal range of +/−Vref. However, due to only three DAC levels it is generally not possible to ensure that the residue signal is always within +/−Vref/4.

As seen in FIG. 6A, for the DAC level of 616, the residue voltage is in the range of +Vref/2 and −Vref/4 (for an absolute range of 3*Vref/4). For the DAC level of 614, the residue voltage is in the range of −Vref/2 to +Vref/4 (again for an absolute range of 3*Vref/4). Only for the DAC level of 615, the residue voltage is in the range of −Vref/4 to +Vref/4 (for an absolute range of Vref/2).

As a result, when the residue signal is amplified by 2 (corresponding to the 2 bit sub-code), the range of amplified signal provided as an input to the next stage can have a range of −Vref to +Vref, as further described below with reference to FIG. 6B.

FIG. 6B summarizes the variation of an output signal (provided as an input to the next stage) of a stage as a function of change in the input signal in the case of a flip-around charge redistribution stage. The X-axis represents the input voltage varying from −Vref to +Vref, consistent with the description in FIG. 6A, and Y-axis represents the amplified residue signal.

As may be readily observed, when the input signal is increased from 632 to 633, the amplified residue signal increases gradually from −Vref/2 to +Vref/2 (with the subcode representing a DAC voltage level of 615). When the input voltage is increased from 633 to +Vref, the amplified residue signal also increases from −Vref/2 to +Vref (with the subcode representing a DAC voltage level of 616). When the input voltage is decreased from 632 to −Vref, the amplified residue signal also decreases from +Vref/2 to −Vref.

The above description is provided with respect to a 2-bit stage with 1-bit redundancy. A N-bit stage with 1-bit redundancy would have $2^N-2$ comparators and $2^N-1$ DAC levels, in general. The gain stage would still have a gain of $2^{(N-1)}$.

It can be readily observed that the flip-around charge redistribution stage can also correct for comparator offsets in the range of +/−Vref/4, similar to a general charge redistribution stage, because the output signal would still map within +/−Vref.

However, the effect of gain error and settling error is different in a flip-around charge redistribution stage, as compared to a general charge redistribution stage. As observed earlier, in a general charge redistribution stage, the output range is always +/−Vref/2 in the absence of comparator offsets. Instead, in a flip-around charge redistribution stage, the output range is +/−Vref even in the absence of comparator offsets. Since the amount of non-linearity caused by the gain and settling error is dependent upon signal swing, a flip-around charge redistribution stage results in higher non-linearities.

Moreover, a cascade of flip-around charge redistribution stages alone (i.e., without general charge redistribution stages) can cause accumulation of non-linearities because all the stages would then have a signal swing of +/−Vref.

However, a flip-around charge redistribution stage implementation consumes less power compared to general charge redistribution stage as described below, and from a power minimization perspective it is desirable to have all the stages implemented as flip-around charge redistribution stages.

Flip-around architecture provides two distinct advantages of area and power over general charge redistribution stage. Lesser number of capacitor and lesser number of switches contribute to lesser area and less parasitic capacitance. Also, flip-around charge redistribution stage implementation poses lesser stringent requirement in selection of operational amplifiers and capacitors when compared to general charge redistribution stage as illustrated below with the help of gain and feedback equations corresponding to each of general charge redistribution stage and flip-around charge redistribution stage respectively.

Gain equation of a general charge redistribution stage is given by:

$$G = \frac{C_{s1} + C_{s2}}{C_f + \frac{C_{s1} + C_{s2} + C_f + C_p}{A}} \qquad \text{Equation 1}$$

wherein Cs1, Cs2, Cf and Cp respectively represent the capacitance values of sampling capacitors 331 and 332, feedback capacitor 362 and parasitic capacitance at the input node of the operational amplifier, and A represents the gain of the operational amplifier.

Under ideal condition with a very high gain A, equation 1 reduces to:

$$G = \frac{C_{s1}}{C_f} + \frac{C_{s2}}{C_f} \quad \text{Equation 2}$$

From equation 2, it may be observed that in case of a mismatch of capacitors (of Cs1 and Cs2 as compared to Cf), the gain will be off from a nominal value of 2.

Feedback factor for general charge redistribution stage given as:

$$\beta = \frac{C_f}{C_{s1} + C_{s2} + C_f + C_p} \quad \text{Equation 3}$$

Wherein Cs1, Cs2, Cf, and Cp respectively represent the capacitance value of capacitors 331, 332, 362, and parasitic capacitance at the input node of the operational amplifier.

From the above equation, under ideal condition when Cp=0 (i.e., best case), maximum feedback factor equals ⅓, which implies a requirement of operational amplifier with higher GBW (gain bandwidth).

In case of flip-around charge redistribution stage, due to the reduced number of capacitors, the gain equation is provided as $$G = \frac{C_{s1} + C_{s2}}{C_{s2} + \frac{C_{s1} + C_{s2} + C_p}{A}} \quad \text{Equation 4}$$

Wherein Cs1, Cs2, and Cp respectively represent the capacitance values of sampling capacitors 531 and 532, and parasitic capacitance at the input node of the operational amplifier, and A represents the gain of the operational amplifier.

Under ideal condition with a very high gain A, equation 4 reduces to $$G = 1 + \frac{C_{s1}}{C_{s2}} \quad \text{Equation 5}$$

Wherein Cs1 and Cs1 represent the capacitance value of capacitors 531 and 532.

Equation 5 indicates that there is less impact on the gain error due to capacitor mismatch because only two capacitors come in the gain equation. Since the matching requirements are relaxed, and the mismatch is inversely dependent on capacitor value, this can help to reduce the capacitor values, and hence area savings in certain cases.

Similarly, the feedback factor for the flip-around charge redistribution stage is given as:

$$\beta = \frac{C_{s2}}{C_{s1} + C_{s2} + C_p} \quad \text{Equation 6}$$

wherein Cs1, Cs1 and Cp represent the capacitance value of capacitors 531 and 532, and parasitic capacitance at the input node of the operational amplifier. From the above equation, under ideal condition when Cp=0 (i.e., best case), maximum feedback factor equals ½, which implies a requirement of operational amplifier with relatively lower GBW (a factor of 1.5 improvement over general charge redistribution stage).

Thus, from equations 3 and 6 above, it may be deduced that an increase in feedback significantly relaxes the operational amplifier GBW (gain and bandwidth) requirement. This helps to reduce the power dissipation and area in the operational amplifier.

Various aspects of the present invention combine the two types of stages described above to attain a desired balance of power/area consumption requirements and bit error.

7. Invention

An aspect of the present invention uses flip-around charge redistribution stages to minimize power consumption and area requirements, and inserts general charge redistribution stages to limit the accumulation of errors (e.g., to keep integral non-linearity to within a desired limit). The bit errors are reduced due to the presence of the general charge redistribution stages and the power/area efficiencies may be obtained by using flip-around charge redistribution stages.

For example, a 10 bit pipeline ADC is implemented generating sub-codes of 1-2-2-2-1-1-1, with the first two gain stages being implemented as flip-around charge redistribution stages and the following two gain stages as general charge redistribution stages, and the last two stages again as flip-around charge redistribution stages. The last 1-bit stage is a simple comparator. Thus, with respect to FIG. 1 (wherein S there equals 7), stages 120-1, 120-2, 120-5 and 120-6 are implemented as flip-around-charge redistribution stages, and stages 120-3 and 120-4 are implemented as general charge redistribution stages and 120-7 as simple comparator.

The interleaving of different types of stages leads to different kinds of sub-codes at the input of the error correction logic. The sub-code output by a general charge redistribution stage has larger number of levels (e.g. 5 level in a 1-effective bit stage mentioned in the example) while a flip-around charge redistribution stage would have only 3 levels for a 1-effective bit implementation. However, there is no conceptual change in the implementation of the error correction logic as both these codes are mapped to equivalent binary codes and weighted addition performed to generate the equivalent overall code.

By implementing 120-1 (first stage) as a flip-around charge redistribution stage, the power and area efficiencies are attained. There is significant power advantage gained because the first stage has the most stringent gain error and settling error requirements, and hence highest power dissipation. There may not be a compromise of error containment requirement because there are no prior stages at which error could have accumulated.

The second stage 120-2 is chosen as a flip-around charge redistribution stage since the estimated accumulated non-linearity (over the first two stages) was determined to be less than a desired limit.

The third and fourth stages 120-3 and 120-4 were implemented as general charge redistribution stages to prevent any further non-linearity accumulation. In general, general charge redistribution stages are used to limit the accumulated error, and to prevent the accumulated error from propagating to the subsequent stages.

Thus, a designer may estimate the accumulation of errors from prior stages, and use general charge redistribution stages when the accumulated error needs to be contained/controlled. In addition, by choosing two consecutive general charge redistribution stages, the possibility of propagating accumulated error to later stages is further reduced.

The description is continued with respect to comparison of observed integral non-linearity (INL) of the above-described embodiment with ADCs implemented using general charge redistribution stages or flip-around charge redistribution stages exclusively. In general, INL represents a difference of the actual input voltage at which a digital code transition takes place (ADC output changes from code I to I+1) and the ideal input voltage at which the code transition should have taken place. For example, assuming that a digital code transition between 49 and 50 should have taken place when input voltage equals 15V (equaling a quantization step size of 0.3, assuming 50 equal steps) but the actual transition takes place only at a voltage of 15.5V, the INL equals (15.5_15=0.5V) (i.e., 5/3 least significant bits, LSBs). In general, the INL needs to be low for low bit errors.

8. Comparison with Prior Approaches

Figure 7A:
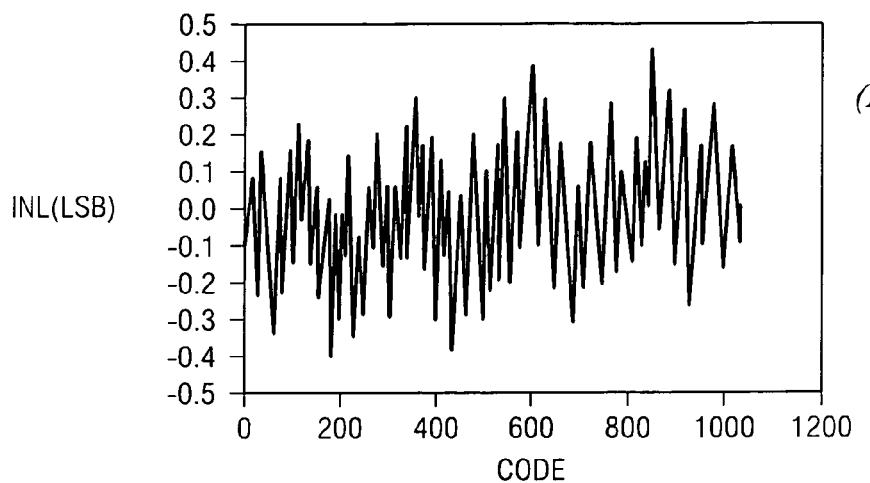
FIG. 7A is a graph illustrating the integral non-linearity (INL) for each ideal code in an ADC implemented using only general charge redistribution stages.
Figure 7B:
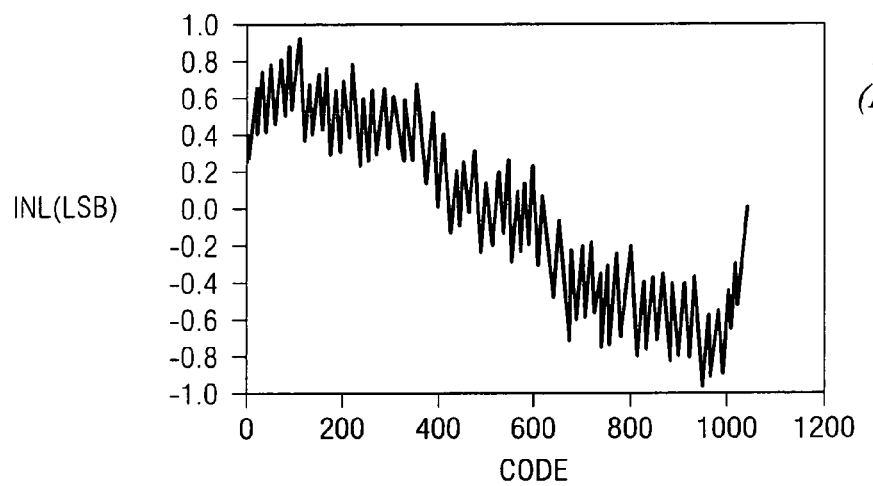
FIG. 7B is a graph illustrating the INL for each ideal code in an ADC implemented using only flip-around charge redistribution stages.
Figure 7C:
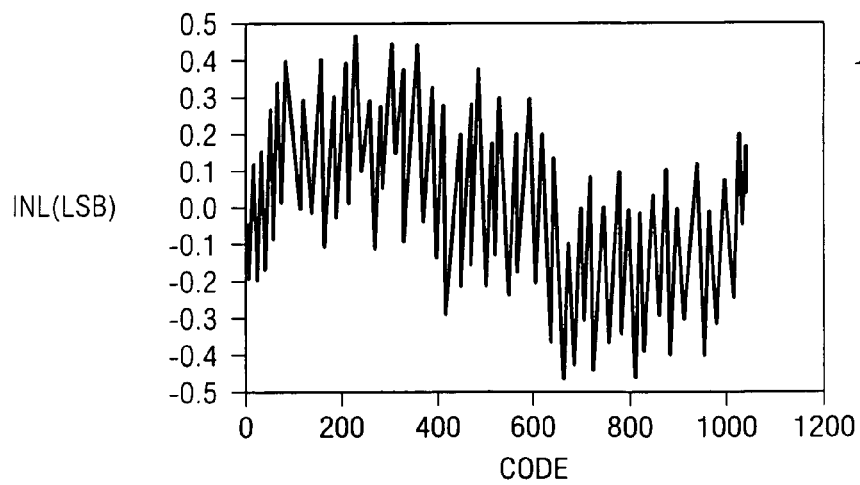
FIG. 7C is a graph illustrating the INL for each ideal code in an ADC implemented according to various aspects of the present invention.

FIGS. 7A, 7B and 7C are graphs illustrating the INL with respect to each ideal code for ADCS implemented using general charge redistribution stages, flip-around charge redistribution stages and in an embodiment of the present invention, respectively. Thus, the X-axis in each graph represents the ideal codes (assuming a 10 bit ADC) and Y-axis the corresponding INL in terms of number of least significant bits (LSBs).

As may be observed in the case of general charge redistribution stages of FIG. 7A, the worst case INL is less than 0.42 LSB. This represents the best case in terms of (minimizing) INL. With respect ADC implemented using all flip-around charge redistribution stages, the INL is shown shooting up to 0.90 LSBs, which represents the worst INL scenario of the three cases. However, this approach provides the best results in terms of minimizing area and power consumption.

FIG. 7C depicts the INL curve with respect to an embodiment of the present invention, and is shown with maximum INL of 0.47 LSB (slightly more than in FIG. 7A). Thus, general charge redistribution stages located in between flip-around charge redistribution stages, prevented the INL accumulation, leading to substantially equal performance with that of the best result (of FIG. 7A), with some compromise of power/area consumption.

From the above, it may be appreciated that an aspect of the present invention uses two types (general and flip-around, in the above examples) of stages to achieve an acceptable combination of various design objectives.

9. CONCLUSION

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An analog-to-digital converter for converting an analog signal to corresponding digital codes comprising:
a plurality of general charge redistribution stages configured to generate a first plurality of sub-codes; and
a plurality of flip-around charge redistribution stages, wherein at least one amplifier in at least one of the plurality of flip-around charge redistribution stages is configured to use a corresponding plurality of capacitors as input capacitors during a sampling phase and as feedback capacitors during a hold phase.

2. An analog-to-digital converter according to claim 1, wherein the plurality of flip-around charge redistribution stages are configured to generate a second plurality of sub-codes, wherein the first plurality of sub-codes and the second plurality of sub-codes are used in generating a digital code corresponding to a sample of the input signal.

3. An analog-to-digital converter according to claim 1, wherein the analog signal is received by at least one flip-around charge redistribution stage.

4. An analog-to-digital converter according to claim 1, further comprising:
at least one comparator coupled to at least one flip-around charge redistribution stage.

5. An analog-to-digital converter comprising:
a first plurality of consecutive flip-around charge redistribution stages, wherein a first one of the first plurality of flip-around charge redistribution stages is configured to receive an input analog signal;
a plurality of consecutive general charge redistribution stages, wherein a first one of the plurality of consecutive general charge redistribution stages is coupled to a last one of the first plurality of consecutive flip-around charge redistribution stages;
a second plurality of consecutive flip-around charge redistribution stages, wherein a first one of the second plurality of consecutive flip-around charge distribution stages is coupled to a last one of the plurality of consecutive general charge redistribution stages; and
at least one comparator coupled to a last one of the second plurality of consecutive flip-around charge redistribution stages wherein at least one amplifier in each one of the first and second plurality of consecutive flip-around charge redistribution stages is configured to use a corresponding plurality of capacitors as input capacitors during a sampling phase and as feedback capacitors during a hold phase.

6. An analog-to-digital converter according to claim 5, wherein
the first plurality of consecutive flip-around charge redistribution stages is configured to generate a first plurality of sub-codes;
the plurality of consecutive general charge redistribution stages is configured to generate a second plurality of sub-codes;
a second plurality of consecutive flip-around charge redistribution stages is configured to generate a third plurality of sub-codes; and
the first, second, and third plurality of sub-codes are used to generate a digital code corresponding to a sample of the input analog signal.

7. An analog-to-digital converter according to claim 6, wherein the digital code comprises ten bits.

8. An analog-to-digital converter according to claim 5, wherein each one of the first and second plurality of consecutive flip-around charge redistribution stages and the plurality of consecutive general charge redistribution stages include at least two stages.

9. A method of converting an analog signal to a digital signal comprising:
processing the analog signal in a first plurality of consecutive flip-around charge redistribution stages to generate a first plurality of sub-codes;
processing output of the first plurality of consecutive flip-around charge redistribution stages in a plurality of consecutive general charge redistribution stages to generate a second plurality of sub-codes;
processing output of the plurality of consecutive general charge redistribution stages in a second plurality of consecutive flip-around charge redistribution stages to generate a third plurality of sub-codes; and
generating a digital code corresponding to a sample of the analog signal using the first, second, and third plurality of sub-codes, wherein at least one amplifier in each one of the first and second plurality of consecutive flip-around charge redistribution stages is configured to use a corresponding plurality of capacitors as input capacitors during a sampling phase and as feedback capacitors during a hold phase.

* * * * *